(12) United States Patent
Murase

(10) Patent No.: US 11,716,811 B2
(45) Date of Patent: Aug. 1, 2023

(54) PRINTED WIRING BOARD

(71) Applicant: IBIDEN CO., LTD., Gifu (JP)

(72) Inventor: Kenji Murase, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/708,215

(22) Filed: Mar. 30, 2022

(65) Prior Publication Data

US 2022/0346231 A1 Oct. 27, 2022

(30) Foreign Application Priority Data

Apr. 26, 2021 (JP) .................................. 2021-073810

(51) Int. Cl.
*H05K 1/11* (2006.01)

(52) U.S. Cl.
CPC ... *H05K 1/113* (2013.01); *H05K 2201/09645* (2013.01)

(58) Field of Classification Search
CPC . H05K 1/11; H05K 1/113; H05K 2201/09645
USPC .......................................................... 174/211
See application file for complete search history.

(56) References Cited

FOREIGN PATENT DOCUMENTS

JP 2013-030514 A 2/2013

*Primary Examiner* — Tremesha S Willis
(74) *Attorney, Agent, or Firm* — Oblon, McClelland, Maier & Neustadt, L.L.P.

(57) ABSTRACT

A printed wiring board includes an insulating layer, and a conductor layer including a solid layer and wirings. The solid layer has an opening part. The wirings are formed in the opening part. The opening part includes first and second opening parts. The wirings include first and second wirings. The first wiring has a first land, a first portion, and a second portion. The second wiring has a second land, a third portion, and a fourth portion extending in parallel to the second portion. A first boundary between the first and second portions is in the second opening part. The first portion is bending at the first boundary and increasing distance between the first and second wirings. A second boundary between the third and fourth portions is in the second opening part. The third portion is bending at the second boundary and increasing distance between the first and second wirings.

20 Claims, 8 Drawing Sheets

PRINTED WIRING BOARD

CROSS-REFERENCE TO RELATED APPLICATIONS

The present application is based upon and claims the benefit of priority to Japanese Patent Application No. 2021-073810, filed Apr. 26, 2021, the entire contents of which are incorporated herein by reference.

BACKGROUND OF THE INVENTION

Field of the Invention

A technology disclosed herein relates to a printed wiring board.

Description of Background Art

Japanese Patent Application Laid-Open Publication No. 2013-30514 describes a signal wiring conductor and a power supply conductor adjacent to the signal wiring conductor. The power supply conductor has an opening part, and the opening part has a side along the signal wiring conductor. The entire contents of this publication are incorporated herein by reference.

Summary of the Invention

According to one aspect of the present invention, a printed wiring board includes a resin insulating layer, and a conductor layer formed on a surface of the resin insulating layer and including a solid layer and wirings formed such that the solid layer has an opening part and that the wirings are formed in the opening part. The conductor layer is formed such that the opening part of the solid layer includes a first opening part and a second opening part connected to the first opening part and that the wirings include a first wiring and a second wiring, the wirings of the conductor layer are formed such that the first wiring has a first land formed in the first opening part, a first portion extending from the first land, and a second portion extending from the first portion and that the second wiring has a second land formed in the first opening part, a third portion extending from the second land, and a fourth portion extending from the third portion and substantially in parallel to the second portion of the first wiring, the first wiring of the wirings is formed such that a first boundary between the first portion and the second portion is formed in the second opening part of the solid layer and that the first portion is bending at the first boundary and increasing a distance between the first wiring and the second wiring, and the second wiring of the wirings is formed such that a second boundary between the third portion and the fourth portion is formed in the second opening part of the solid layer and that the third portion is bending at the second boundary and increasing the distance between the first wiring and the second wiring.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
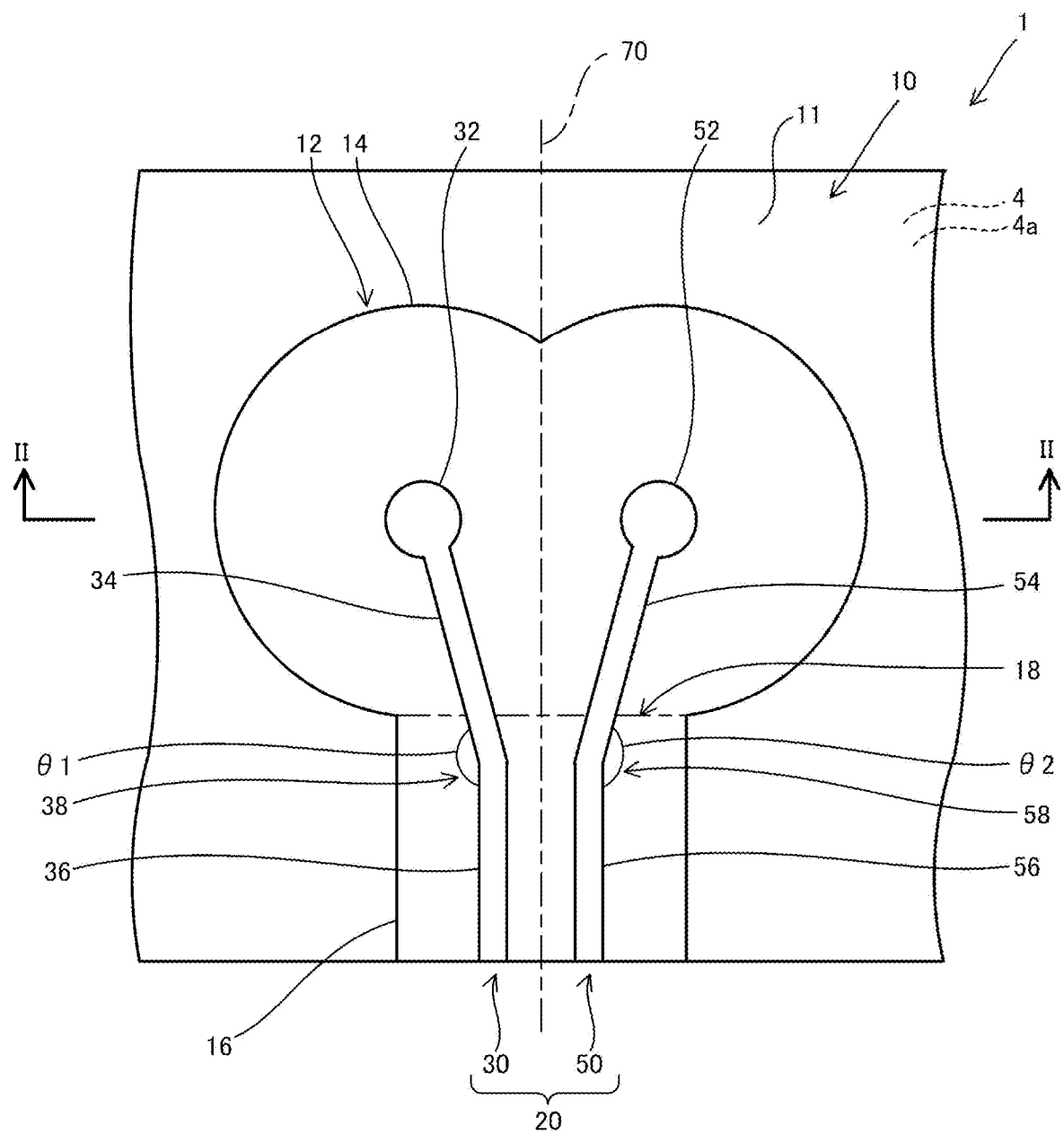
FIG. 1 is a plan view schematically illustrating a part of a printed wiring board according to an embodiment of the present invention.

Embodiments will now be described with reference to the accompanying drawings, wherein like reference numerals designate corresponding or identical elements throughout the various drawings.

EMBODIMENT

Figure 2:
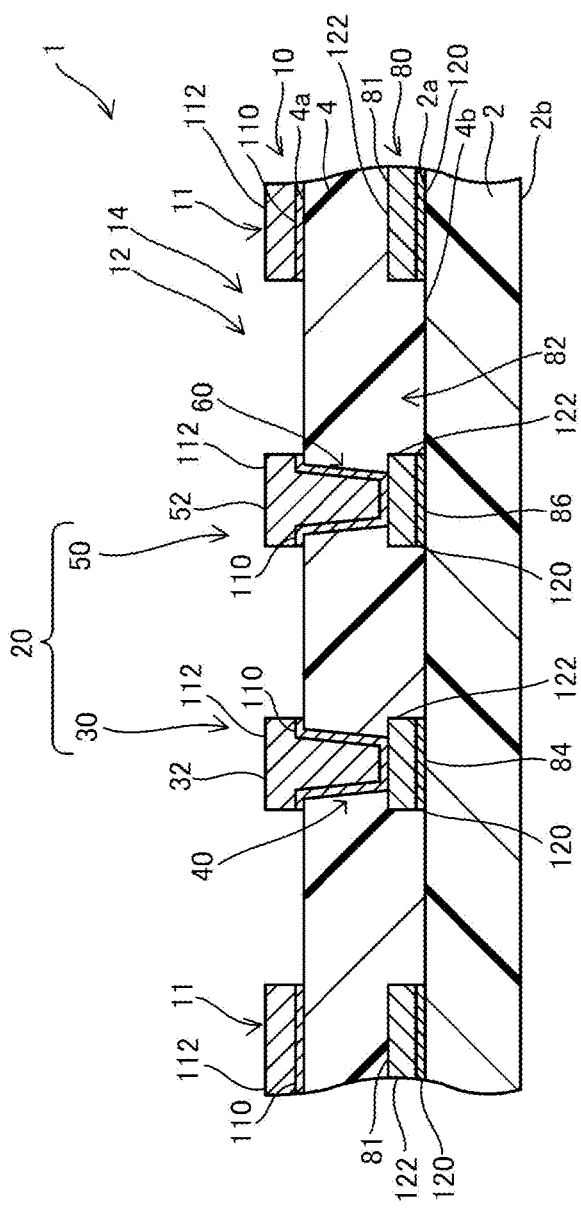
FIG. 2 is a cross-sectional view between II-II of FIG. 1.
Figure 3:
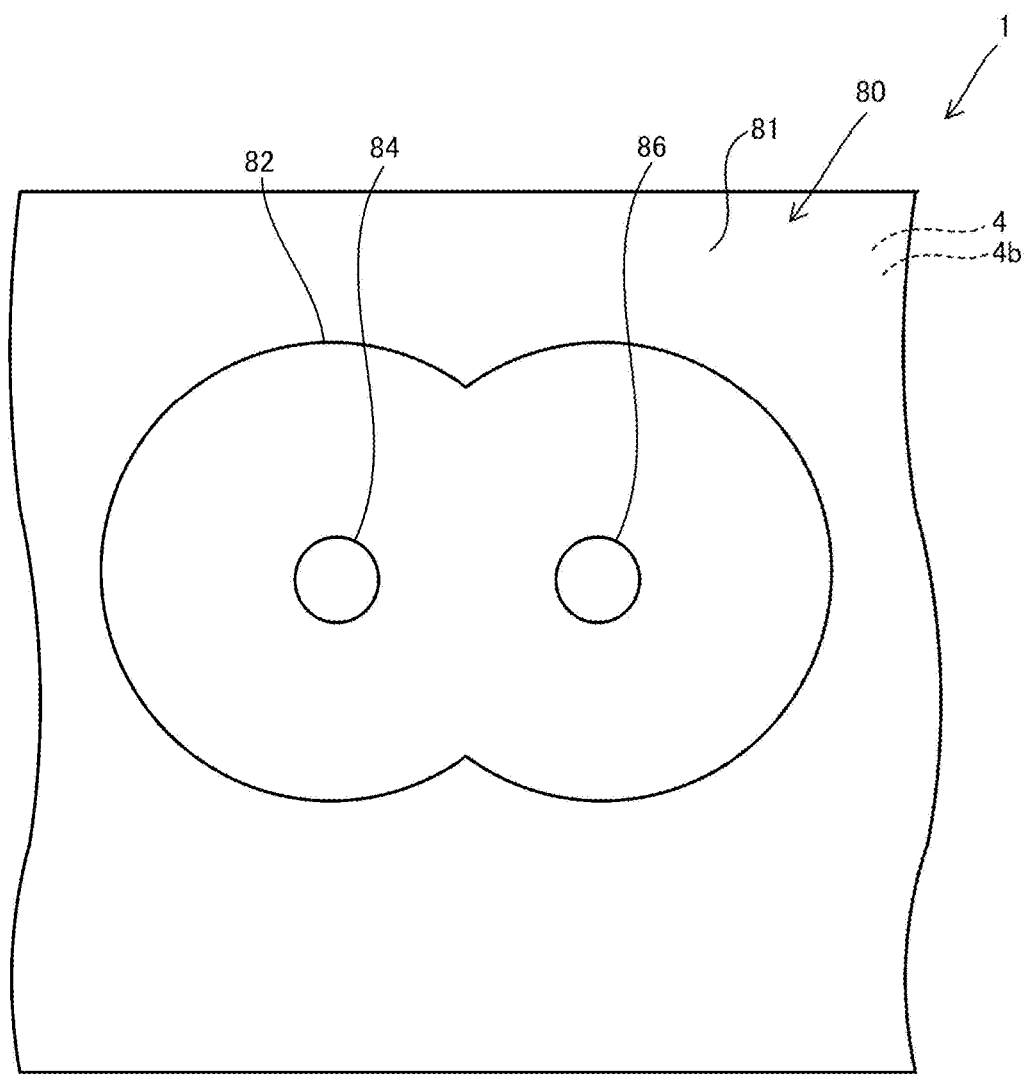
FIG. 3 is a bottom view schematically illustrating a part of the printed wiring board according to the embodiment of the present invention.

FIG. 1 is a plan view illustrating a part of a printed wiring board 1 of an embodiment. FIG. 1 illustrates a first resin insulating layer 4 having a first surface (4a) and a first conductor layer 10 formed on the first surface (4a) of the first resin insulating layer 4. FIG. 2 is a cross-sectional view of the printed wiring board 1 of FIG. 1. FIG. 2 is obtained by cutting the printed wiring board 1 of FIG. 1 in a plane perpendicular to the first surface (4a). FIG. 2 is a cross-sectional view between II-II of FIG. 1. FIG. 3 is a bottom view illustrating a part of the printed wiring board 1 of the embodiment. FIG. 3 illustrates a second surface (4b) of the first resin insulating layer 4 and a second conductor layer 80 in contact with the second surface (4b).

As illustrated in FIG. 2, the printed wiring board 1 includes: a second resin insulating layer 2; the second conductor layer 80 on the second resin insulating layer 2; the first resin insulating layer 4 on the second resin insulating layer 2 and the second conductor layer 80; and the first conductor layer 10 on the first resin insulating layer 4. The second resin insulating layer 2 can form a core substrate. The second resin insulating layer 2 can form a resin insulating layer that forms a build-up layer.

The second resin insulating layer 2 has a third surface (2a) and a fourth surface (2b) on the opposite side with respect to third surface (2a). The second resin insulating layer 2 is formed using a thermosetting resin. The second resin insulating layer 2 may contain inorganic particles such as silica particles. The second resin insulating layer 2 may contain a reinforcing material such as a glass cloth.

As illustrated in FIG. 2, the second conductor layer 80 is formed on the third surface (2a) of the second resin insulating layer 2. The second conductor layer 80 is formed of copper. As illustrated in FIGS. 2 and 3, the second conductor layer 80 includes a second solid layer 81, a first pad 84, and a second pad 86. The second solid layer 81 has a third opening part 82 that exposes the third surface (2a). The third opening part 82 is positioned directly below a first opening part 14 (FIG. 1). The first opening part 14 will be described later. The second solid layer 81 is, for example, a power supply layer. It is also possible that the second solid layer 81 is a ground layer. The first pad 84 is formed in the third opening part 82. The second pad 86 is formed in the third opening part 82. The second solid layer 81, the first pad 84 and the second pad 86 are formed of a seed layer 120 and an electrolytic plating film 122 on the seed layer 120.

As illustrated in FIG. 2, the first resin insulating layer 4 is formed on the third surface (2a) of the second resin insulating layer 2 and the second conductor layer 80. The first resin insulating layer 4 has the first surface (4a) and a second surface (4b) on the opposite side with respect to the first surface (4a). The second surface (4b) of the first resin insulating layer 4 covers the third surface (2a) of the second resin insulating layer 2 and the second conductor layer 80. The first resin insulating layer 4 fills the third opening part 82. The first resin insulating layer 4 may contain inorganic particles such as silica particles. The first resin insulating layer 4 may contain a reinforcing material such as a glass cloth.

As illustrated in FIGS. 1 and 2, the first conductor layer 10 is formed on the first surface (4a) of the first resin insulating layer 4. The first conductor layer 10 is formed of copper. As illustrated in FIG. 1, the first conductor layer 10 includes a first solid layer 11 and pair wirings 20. The first solid layer 11 has an opening part 12 that exposes the first surface (4a). The first solid layer 11 is, for example, a power supply layer. It is also possible that the first solid layer 11 is a ground layer. The first solid layer 11 and the pair wirings 20 are formed of a seed layer 110 and an electrolytic plating film 112 on the seed layer 110.

A first via conductor 40 and a second via conductor 60 that penetrate the first resin insulating layer 4 are formed in the first resin insulating layer 4. The first via conductor 40 and the second via conductor 60 are formed of copper. The first via conductor 40 is connected to the first pad 84. The second via conductor 60 is connected to the second pad 86. The first via conductor 40 and the second via conductor 60 are formed of a seed layer 110 and an electrolytic plating film 112 on the seed layer 110. The seed layer 110 is an electroless plating film. The first via conductor 40 and the second via conductor 60 connect the first conductor layer 10 and the second conductor layer 80.

The opening part 12 has the first opening part 14 and a second opening part 16 connected to the first opening part 14. The first opening part 14 is positioned directly above the third opening part 82 (see FIGS. 2 and 3). As illustrated in FIGS. 1 and 3, a shape of the first opening part 14 and a shape of the third opening part 82 are substantially the same.

As illustrated in FIG. 1, the pair wirings 20 are formed in the opening part 12. The pair wirings 20 include a first wiring 30 and a second wiring 50. The first wiring 30 includes a first land 32 formed in the first opening part 14, a first portion 34 extending from the first land 32, and a second portion 36 extending from the first portion 34. The second wiring 50 includes a second land 52 formed in the first opening part 14, a third portion 54 extending from the second land 52, and a fourth portion 56 extending from the third portion 54. The first via conductor 40 is positioned directly on the first pad 84. The first via conductor 40 connects the first pad 84 and the first land 32. The second via conductor 60 is positioned directly on the second pad 86. The second via conductor 60 connects the second pad 86 and the second land 52.

The second portion 36 and the fourth portion 56 are formed in the second opening part 16. The second portion 36 and the fourth portion 56 extend substantially in parallel.

A first boundary 38 between the first portion 34 and the second portion 36 is positioned in the second opening part 16. The first portion 34 bends at the first boundary 38 such that a distance between the first wiring 30 and the second wiring 50 increases. The first portion 34 extends straight from the second portion 36 to the first land 32. The first portion 34 extends beyond a boundary 18 between the first opening part 14 and the second opening part 16, and reaches from the second portion 36 to the first land 32.

A second boundary 58 between the third portion 54 and the fourth portion 56 is positioned in the second opening part 16. The third portion 54 bends at the second boundary 58 such that the distance between the first wiring 30 and the second wiring 50 increases. The third portion 54 extends straight from the fourth portion 56 to the second land 52. The third portion 54 extends beyond the boundary 18 and reaches from the fourth portion 56 to the second land 52.

As illustrated in FIG. 1, when an imaginary straight line 70 is drawn between the first wiring 30 and the second wiring 50, the first portion 34 and the third portion 54 are line-symmetric with respect to the imaginary straight line 70. A first angle ($\theta 1$) between the first portion 34 and the second portion 36 is 145 degrees or more and 165 degrees or less. A second angle ($\theta 2$) between the third portion 54 and the fourth portion 56 is 145 degrees or more and 165 degrees or less.

Figure 4:
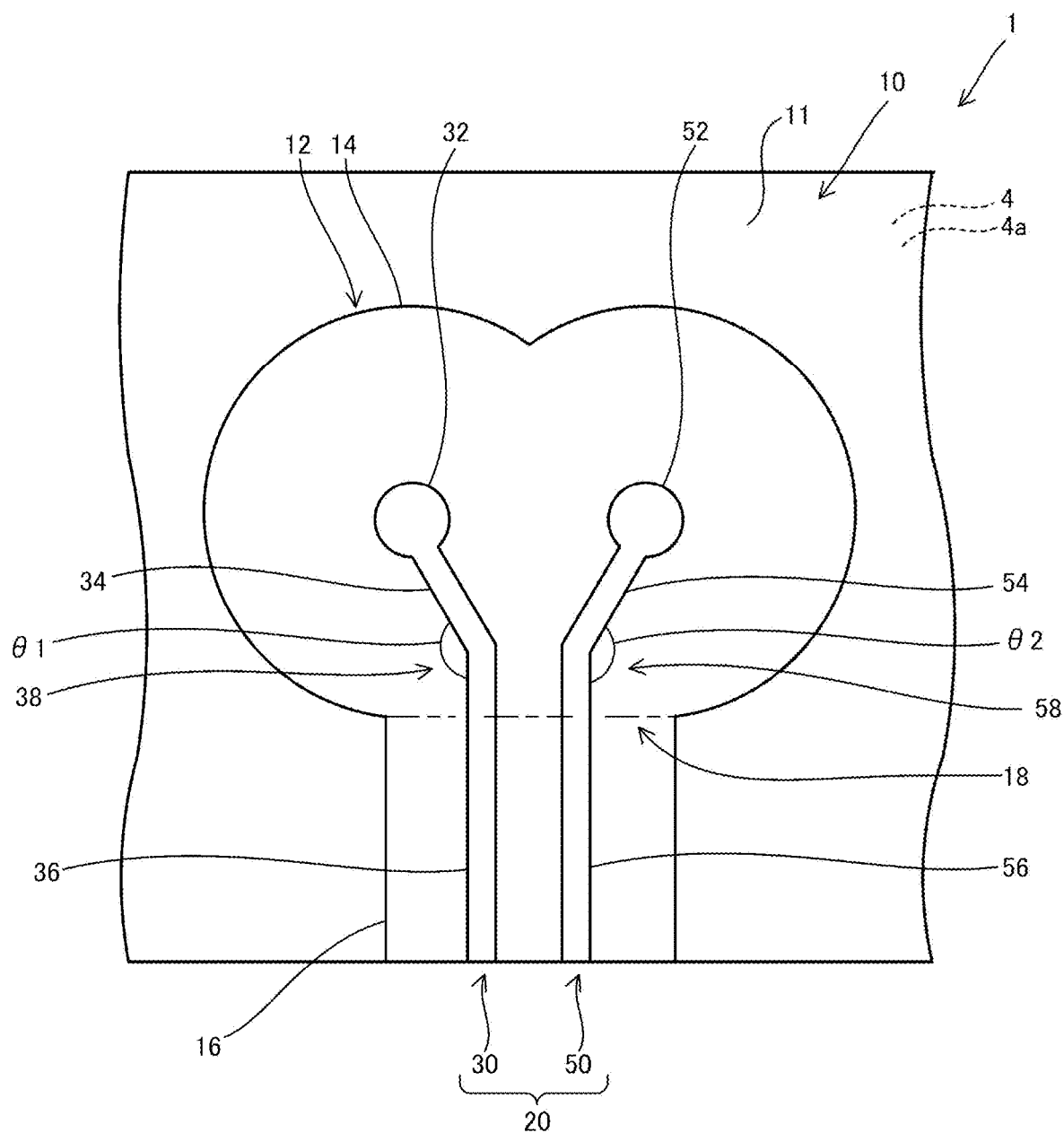
FIG. 4 is a plan view schematically illustrating a part of a printed wiring board according to a reference example.

In the embodiment, the first portion 34 bends in the second opening part 16 and extends to the first land 32. The third portion 54 bends in the second opening part 16 and extends to the second land 52. FIG. 4 illustrates a reference example. A difference between the embodiment and the reference example is in the positions of the first boundary 38 and the second boundary 58. In the reference example, the first boundary 38 and the second boundary 58 are formed in the first opening part 14. When the embodiment and the reference example are compared, the first portion 34 of the embodiment has a longer length than the first portion 34 of the reference example. The third portion 54 of the embodiment has a longer length than the third portion 54 of the reference example. Therefore, according to the embodiment, the first angle ($\theta 1$) between the first portion 34 and the second portion 36 can be increased. The second angle ($\theta 2$) between the third portion 54 and the fourth portion 56 can be increased. For example, the first angle ($\theta 1$) in the reference example is smaller than the first angle ($\theta 1$) in the embodiment. The second angle ($\theta 2$) in the reference example is smaller than the second angle ($\theta 2$) in the embodiment. According to the embodiment, a transmission loss can be reduced.

In the embodiment, the first boundary 38 and the second boundary 58 are positioned in the second opening part 16. A distance between the boundary 18 (between the first opening part 14 and the second opening part 16) and the first boundary 38 can be increased. A distance between the boundary 18 (between the first opening part 14 and the second opening part 16) and the second boundary 58 can be increased. According to the printed wiring board 1 of the embodiment, the first wiring 30 and the second wiring 50 are unlikely to break.

In the embodiment, the first portion 34 and the third portion 54 are line-symmetric with respect to the imaginary straight line 70. The second portion 36 and the fourth portion 56 extend substantially in parallel. The first wiring 30 and the second wiring 50 are line-symmetric with respect to the imaginary straight line 70. A design of the first wiring 30 and a design of the second wiring 50 are substantially the same. A wiring length of the first wiring 30 and a wiring length of the second wiring 50 are substantially equal to each other. Therefore, impedance values of the first wiring 30 and the second wiring 50 can be matched.

Method for Manufacturing Printed Wiring Board

Figure 5A:
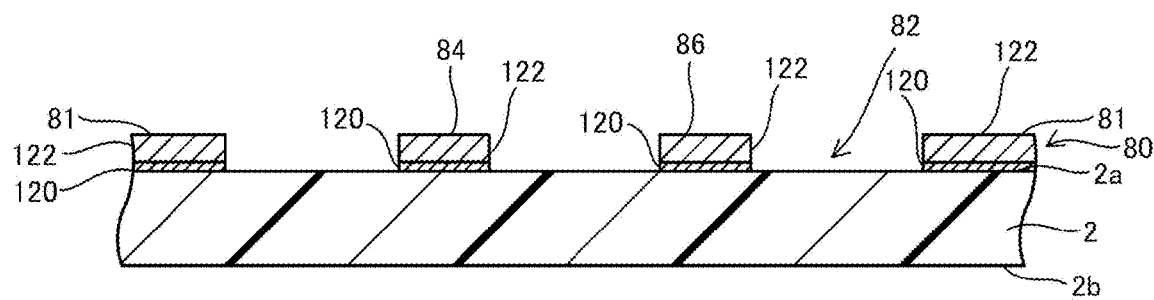
FIG. 5A is a cross-sectional view schematically illustrating a method for manufacturing a printed wiring board according to an embodiment of the present invention.
Figure 5B:
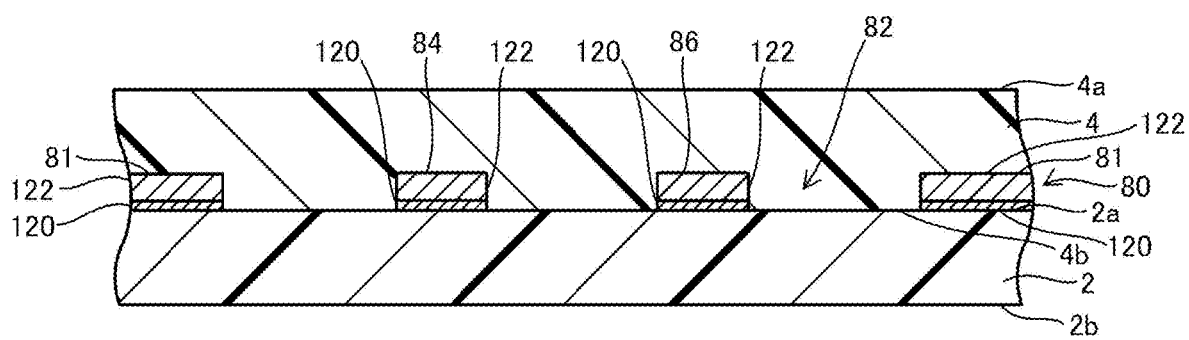
FIG. 5B is a cross-sectional view schematically illustrating a method for manufacturing a printed wiring board according to an embodiment of the present invention.
Figure 5C:
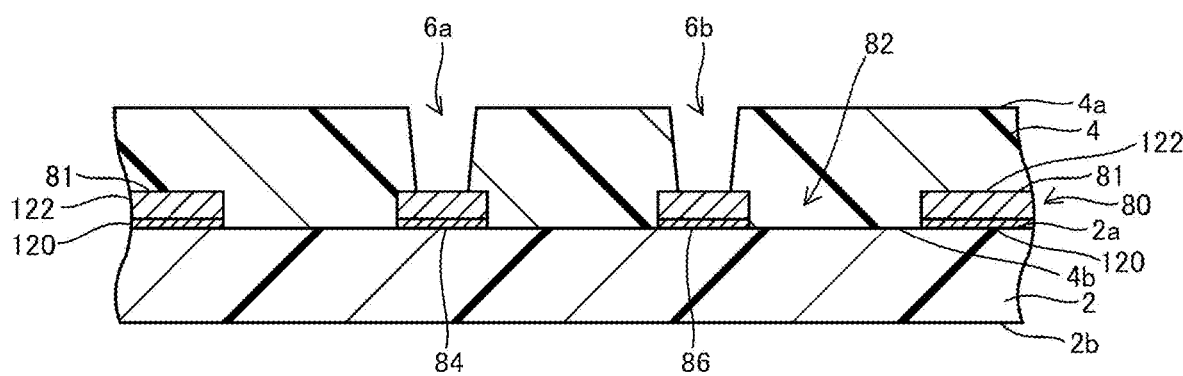
FIG. 5C is a cross-sectional view schematically illustrating a method for manufacturing a printed wiring board according to an embodiment of the present invention.
Figure 5D:
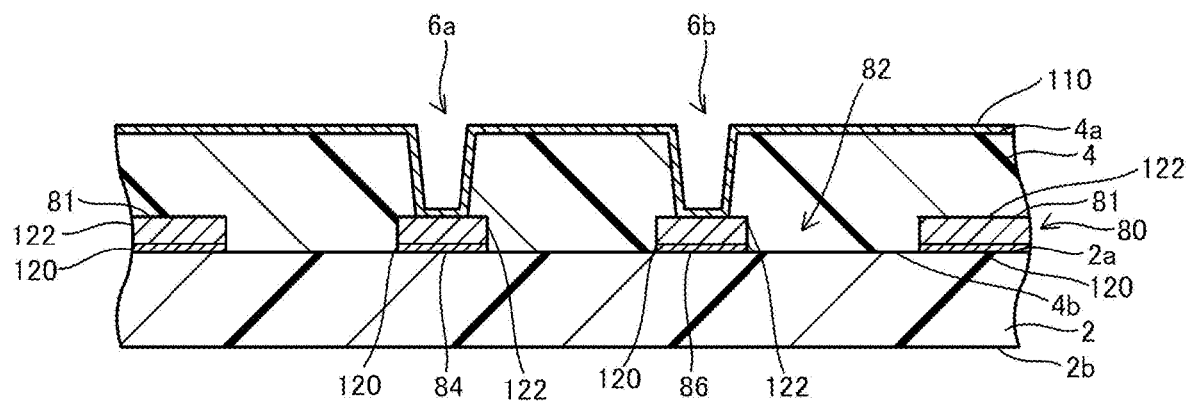
FIG. 5D is a cross-sectional view schematically illustrating a method for manufacturing a printed wiring board according to an embodiment of the present invention.
Figure 5E:
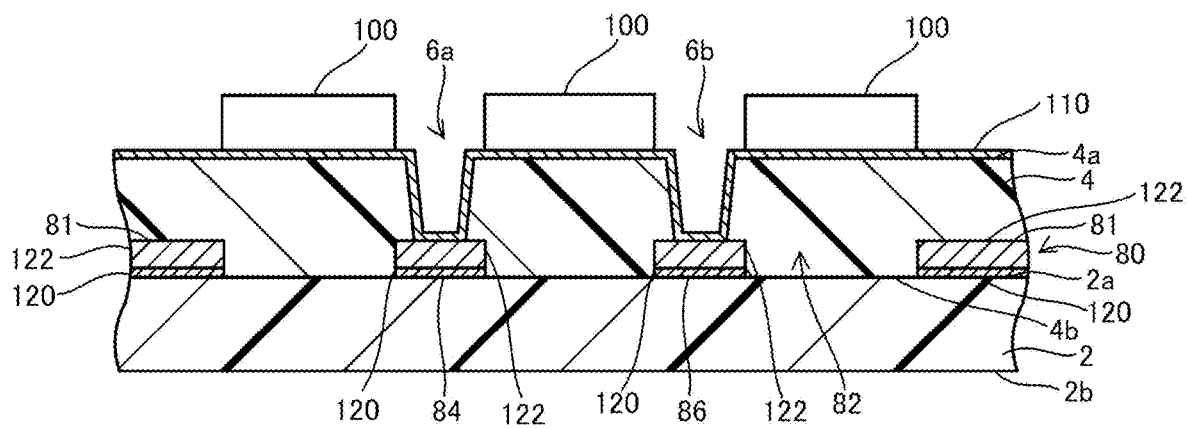
FIG. 5E is a cross-sectional view schematically illustrating a method for manufacturing a printed wiring board according to an embodiment of the present invention.
Figure 5F:
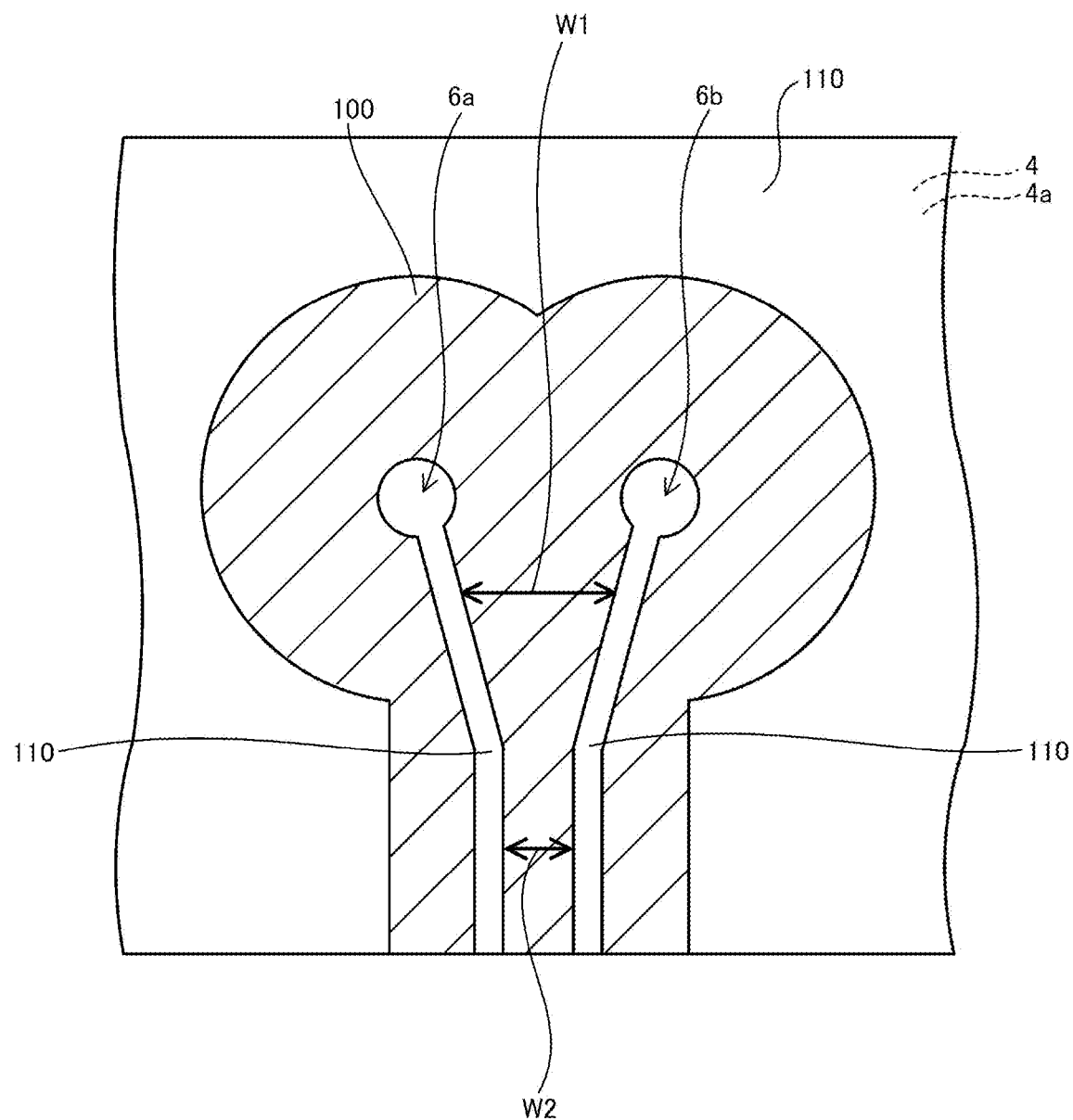
FIG. 5F is a plan view schematically illustrating a method for manufacturing a printed wiring board according to an embodiment of the present invention.

FIGS. 5A-5H illustrate a method for manufacturing the printed wiring board 1 of the embodiment. FIGS. 5A-5E and 5G-5H are cross-sectional views. FIG. 5F is a plan view. FIG. 5A illustrates the second resin insulating layer 2 having the third surface (2a) and the fourth surface (2b) and the second conductor layer 80 on the third surface (2a). The second conductor layer 80 has the third opening part 82. As illustrated in FIG. 5B, the first resin insulating layer 4 is formed on the third surface (2a) and the second conductor layer 80. The first resin insulating layer 4 fills the third opening part 82. Therefore, the first surface (4a) directly above the third opening part 82 is more likely to be recessed relative the first surface (4a) on the second conductor layer 80 around the third opening part 82.

Laser is irradiated to the first resin insulating layer 4. As illustrated in FIG. 5C, an opening (6a) is formed in the first resin insulating layer 4 directly on the first pad 84. An opening (6b) is formed in the first resin insulating layer 4 directly on the second pad 86.

As illustrated in FIG. 5D, the seed layer 110 is formed on the first surface (4a) of the first resin insulating layer 4. As illustrated in FIGS. 5E and 5F, a plating resist 100 is formed on the seed layer 110. As illustrated in FIG. 5F, the plating resist 100 has openings for forming the pair wirings 20 (FIG. 1) and an opening for forming the first solid layer 11 (FIG. 1).

Figure 5G:
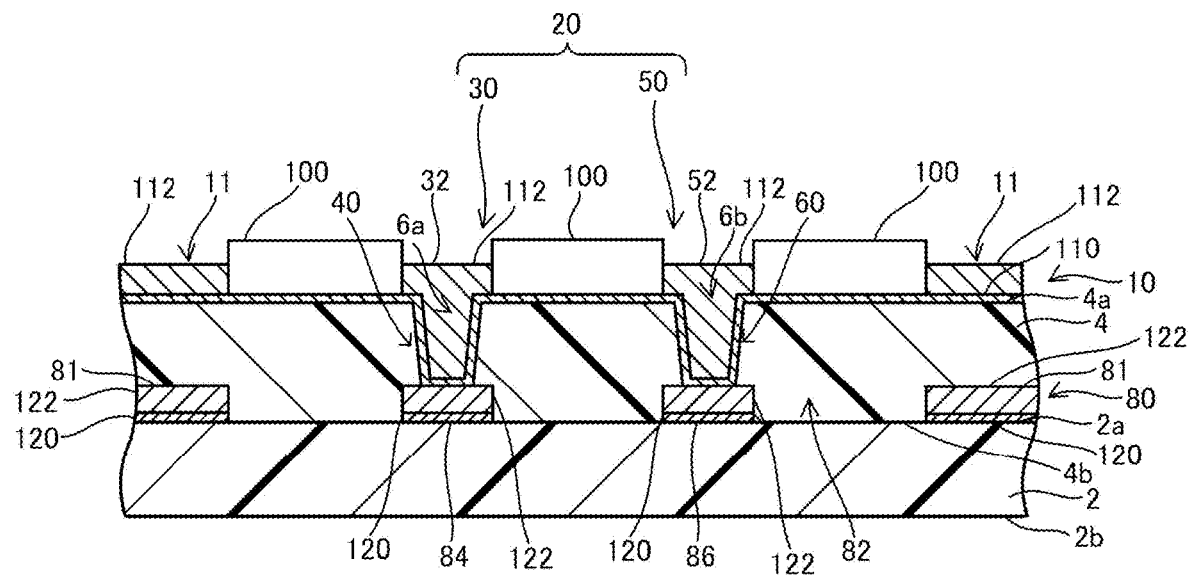
FIG. 5G is a cross-sectional view schematically illustrating a method for manufacturing a printed wiring board according to an embodiment of the present invention.

As illustrated in FIG. 5G, the electrolytic plating film 112 is formed on the seed layer 110 exposed from the plating resist 100. The electrolyte plating film 112 fills the openings (6a, 6b). The first via conductor 40, the second via conductor 60, the first solid layer 11, and the pair wirings 20 are formed by the seed layer 110 and the electrolytic plating film 112 formed on the seed layer 110. The first conductor layer 10 is formed on the first surface (4a).

Figure 5H:
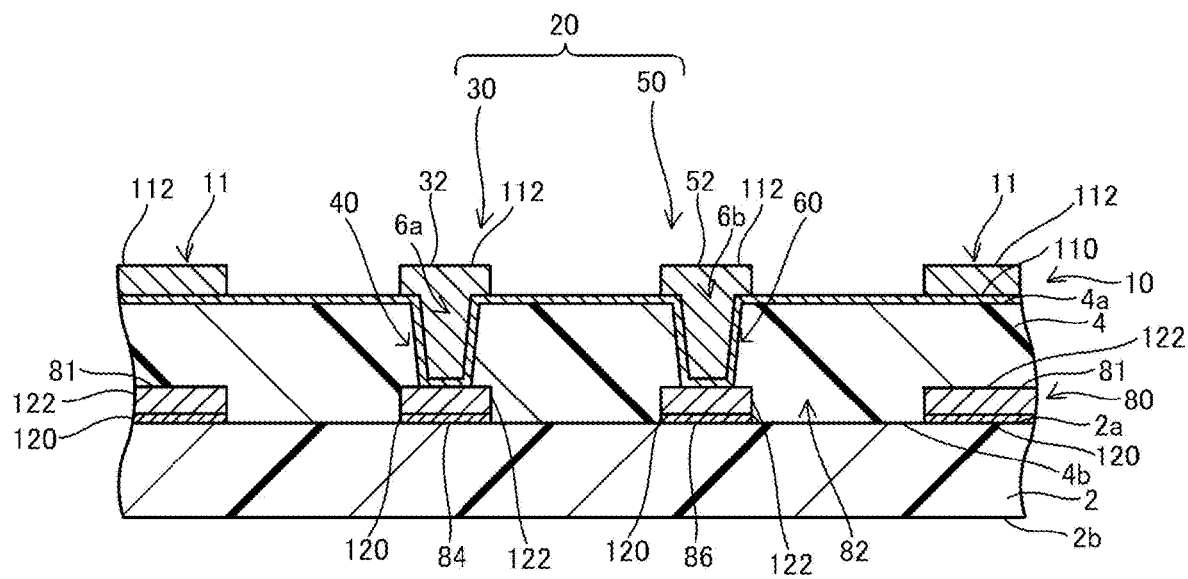
FIG. 5H is a cross-sectional view schematically illustrating a method for manufacturing a printed wiring board according to an embodiment of the present invention.

As illustrated in FIG. 5H, the plating resist 100 is removed. After that, the seed layer 110 that is exposed from the electrolytic plating film 112 is removed. The printed wiring board 1 (FIG. 1) of the embodiment is obtained.

FIG. 5F illustrates widths (W1, W2) of the plating resist 100. The width (W1) indicates a width of the plating resist 100 between an opening of the plating resist 100 for forming the second portion 34 and an opening of the plating resist 100 for forming the fourth portion 54. The width (W2) indicates a width of the plating resist 100 between an opening of the plating resist 100 for forming the first portion 36 and an opening of the plating resist 100 for forming the third portion 56. In the embodiment, the first wiring 30 and the second wiring 50 bend in the second opening part 16. Therefore, the plating resist 100 positioned directly above the third opening part 82 has the width (W1). In contrast, when the first wiring 30 and the second wiring 50 bend in the first opening part 16, the plating resist 100 positioned directly above the third opening part 82 has the width (W1) and the width (W2). The widths (W1, W2) affect adhesion between the plating resist 100 and the seed layer 110. As illustrated in FIG. 5F, the width (W1) is larger than the width (W2). Therefore, according to the embodiment, the plating resist 100 positioned directly above the third opening part 82 is unlikely to peel off from the seed layer 110. Even when the first surface (4a) directly above the third opening part 82 is recessed relative to the first surface (4a) on the second conductor layer 80 around the third opening part 82, the plating resist 100 is unlikely to peel off from the seed layer 110. Therefore, a short circuit between the first wiring 30 and the second wiring 50 can be suppressed.

First Modified Embodiment

A first modified embodiment is substantially the same as the embodiment. Examples of differences are described below. In the first modified embodiment, the third opening part 82 is not formed directly below the first opening part 14. The third opening part 82 is not formed. The first via conductor 40 and the second via conductor 60 are not formed.

Second Modified Embodiment

In a second modified embodiment, the first portion 34 and the third portion 54 are not line-symmetric with respect to the imaginary straight line 70 (FIG. 1). The first portion 34 and the third portion 54 have different lengths. The first angle ($\theta 1$) and the second angle ($\theta 2$) are different from each other.

In the technology of Japanese Patent Application Laid-Open Publication No. 2013-30514, the opening part has a side along the signal wiring conductor (signal wiring). Therefore, it is thought that, when the signal wiring in the opening part bends, the power supply conductor bends along the signal wiring. It is thought that, when the signal wiring bends, a corner of the power supply conductor and a corner of the signal wiring are positioned on one straight line. It is thought that, when a wiring substrate of Japanese Patent Application Laid-Open Publication No. 2013-30514 is subjected to a stress, the stress is transmitted from the corner of the power supply conductor to the corner of the signal wiring in a shortest distance. It is thought that the signal wiring is likely to break.

A printed wiring board according to an embodiment of the present invention includes: a first resin insulating layer having a first surface and a second surface on the opposite side with respect to the first surface; and a first conductor layer formed on the first surface. The first conductor layer includes: a first solid layer having an opening part that exposes the first surface; and pair wirings formed in the opening part. The opening part includes a first opening part and a second opening part connected to the first opening part. The pair wirings include a first wiring and a second wiring, the first wiring including a first land formed in the first opening part, a first portion extending from the first land, and a second portion extending from the first portion, and the second wiring including a second land formed in the first opening part, a third portion extending from the second land, and a fourth portion extending from the third portion.

The second portion and the fourth portion extend substantially in parallel. A first boundary between the first portion and the second portion is positioned in the second opening part. A second boundary between the third portion and the fourth portion is positioned in the second opening part. The first portion bends at the first boundary such that a distance between the first wiring and the second wiring increases. The third portion bends at the second boundary such that the distance between the first wiring and the second wiring increases.

A printed wiring board according to an embodiment of the present invention includes the opening part formed of the first opening part and the second opening part. The printed wiring board of the embodiment further includes the first wiring and the second wiring in the opening part. The first wiring is formed of the first portion and the second portion, and bends at the first boundary between the first portion and the second portion. The second wiring is formed of the third portion and the fourth portion, and bends at the second boundary between the third portion and the fourth portion. The first boundary and the second boundary are positioned in the second opening part. Therefore, a distance between a boundary between the first opening part and the second opening part and the first boundary can be increased. A distance between the boundary between the first opening part and the second opening part and the second boundary can be increased. According to the printed wiring board of the embodiment, the first wiring and the second wiring are unlikely to break.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a resin insulating layer; and
   a conductor layer formed on a surface of the resin insulating layer and comprising a solid layer and a plurality of wirings formed such that the solid layer has an opening part and that the plurality of wirings is formed in the opening part,
   wherein the conductor layer is formed such that the opening part of the solid layer includes a first opening part and a second opening part connected to the first opening part and that the plurality of wirings includes a first wiring and a second wiring, the plurality of wirings of the conductor layer is formed such that the first wiring has a first land formed in the first opening part, a first portion extending from the first land, and a second portion extending from the first portion and that the second wiring has a second land formed in the first opening part, a third portion extending from the second land, and a fourth portion extending from the third portion and substantially in parallel to the second portion of the first wiring, the first wiring of the plurality of wirings is formed such that a first boundary between the first portion and the second portion is formed in the second opening part of the solid layer and that the first portion is bending at the first boundary and increasing a distance between the first wiring and the second wiring, and the second wiring of the plurality of wirings is formed such that a second boundary between the third portion and the fourth portion is formed in the second opening part of the solid layer and that the third portion is bending at the second boundary and increasing the distance between the first wiring and the second wiring.

2. The printed wiring board according to claim 1, wherein the first wiring of the plurality of wirings is formed such that the first portion is extending straight from the second portion to the first land, and the second wiring of the plurality of wirings is formed such that the third portion is extending straight from the fourth portion to the second land.

3. The printed wiring board according to claim 1, wherein the first wiring of the plurality of wirings is formed such that the first portion is extending beyond a boundary between the first opening part and second opening part of the solid layer and reaching from the second portion to the first land, and the second wiring of the plurality of wirings is formed such that the third portion is extending beyond the boundary between the first opening part and second opening part of the solid layer and reaching from the fourth portion to the second land.

4. The printed wiring board according to claim 1, wherein the plurality of wirings of the conductor layer is formed such that the first portion of the first wiring and the third portion of the second wiring are line-symmetric with respect to an imaginary straight line drawn between the first wiring and the second wiring.

5. The printed wiring board according to claim 4, wherein the first wiring of the plurality of wirings is formed such that a first angle between the first portion and the second portion is in a range of 145 degrees to 165 degrees, and the second wiring of the plurality of wirings is formed such that a second angle between the third portion and the fourth portion is in a range of 145 degrees to 165 degrees.

6. The printed wiring board according to claim 1, further comprising:
   a second resin insulating layer formed on the resin insulating layer;
   a second conductor layer formed on a surface of the second resin insulating layer; and
   a plurality of via conductors penetrating through the resin insulating layer such that the plurality of via conductors is connecting the conductor layer and the second conductor layer,
   wherein the second conductor layer includes a second solid layer, a first pad and a second pad formed such that the second solid layer has a third opening part and that the first pad and second pad are formed in the third opening part of the solid layer, the plurality of via conductors include a first via conductor connecting the first pad of the second conductor layer and the first land of the first wiring, and a second via conductor connecting the second pad of the second conductor layer and the second land of the second wiring, and the second conductor layer is formed such that the third opening part of the second solid layer is formed directly below the first opening part of the solid layer in the conductor layer and that the third opening part of the second solid layer has a shape which is substantially a same as a shape of the first opening part of the solid layer in the conductor layer.

7. The printed wiring board according to claim 2, wherein the first wiring of the plurality of wirings is formed such that the first portion is extending beyond a boundary between the first opening part and second opening part of the solid layer and reaching from the second portion to the first land, and the second wiring of the plurality of wirings is formed such that the third portion is extending beyond the boundary between the first opening part and second opening part of the solid layer and reaching from the fourth portion to the second land.

8. The printed wiring board according to claim 2, wherein the plurality of wirings of the conductor layer is formed such that the first portion of the first wiring and the third portion of the second wiring are line-symmetric with respect to an imaginary straight line drawn between the first wiring and the second wiring.

9. The printed wiring board according to claim 8, wherein the first wiring of the plurality of wirings is formed such that a first angle between the first portion and the second portion is in a range of 145 degrees to 165 degrees, and the second wiring of the plurality of wirings is formed such that a second angle between the third portion and the fourth portion is in a range of 145 degrees to 165 degrees.

10. The printed wiring board according to claim 2, further comprising:
a second resin insulating layer formed on the resin insulating layer;
a second conductor layer formed on a surface of the second resin insulating layer; and
a plurality of via conductors penetrating through the resin insulating layer such that the plurality of via conductors is connecting the conductor layer and the second conductor layer,
wherein the second conductor layer includes a second solid layer, a first pad and a second pad formed such that the second solid layer has a third opening part and that the first pad and second pad are formed in the third opening part of the solid layer, the plurality of via conductors include a first via conductor connecting the first pad of the second conductor layer and the first land of the first wiring, and a second via conductor connecting the second pad of the second conductor layer and the second land of the second wiring, and the second conductor layer is formed such that the third opening part of the second solid layer is formed directly below the first opening part of the solid layer in the conductor layer and that the third opening part of the second solid layer has a shape which is substantially a same as a shape of the first opening part of the solid layer in the conductor layer.

11. The printed wiring board according to claim 3, wherein the plurality of wirings of the conductor layer is formed such that the first portion of the first wiring and the third portion of the second wiring are line-symmetric with respect to an imaginary straight line drawn between the first wiring and the second wiring.

12. The printed wiring board according to claim 11, wherein the first wiring of the plurality of wirings is formed such that a first angle between the first portion and the second portion is in a range of 145 degrees to 165 degrees, and the second wiring of the plurality of wirings is formed such that a second angle between the third portion and the fourth portion is in a range of 145 degrees to 165 degrees.

13. The printed wiring board according to claim 3, further comprising:
a second resin insulating layer formed on the resin insulating layer;
a second conductor layer formed on a surface of the second resin insulating layer; and
a plurality of via conductors penetrating through the resin insulating layer such that the plurality of via conductors is connecting the conductor layer and the second conductor layer,
wherein the second conductor layer includes a second solid layer, a first pad and a second pad formed such that the second solid layer has a third opening part and that the first pad and second pad are formed in the third opening part of the solid layer, the plurality of via conductors include a first via conductor connecting the first pad of the second conductor layer and the first land of the first wiring, and a second via conductor connecting the second pad of the second conductor layer and the second land of the second wiring, and the second conductor layer is formed such that the third opening part of the second solid layer is formed directly below the first opening part of the solid layer in the conductor layer and that the third opening part of the second solid layer has a shape which is substantially a same as a shape of the first opening part of the solid layer in the conductor layer.

14. The printed wiring board according to claim 4, further comprising:
a second resin insulating layer formed on the resin insulating layer;
a second conductor layer formed on a surface of the second resin insulating layer; and
a plurality of via conductors penetrating through the resin insulating layer such that the plurality of via conductors is connecting the conductor layer and the second conductor layer,
wherein the second conductor layer includes a second solid layer, a first pad and a second pad formed such that the second solid layer has a third opening part and that the first pad and second pad are formed in the third opening part of the solid layer, the plurality of via conductors include a first via conductor connecting the first pad of the second conductor layer and the first land of the first wiring, and a second via conductor connecting the second pad of the second conductor layer and the second land of the second wiring, and the second conductor layer is formed such that the third opening part of the second solid layer is formed directly below the first opening part of the solid layer in the conductor layer and that the third opening part of the second solid layer has a shape which is substantially a same as a shape of the first opening part of the solid layer in the conductor layer.

15. The printed wiring board according to claim 5, further comprising:
a second resin insulating layer formed on the resin insulating layer;
a second conductor layer formed on a surface of the second resin insulating layer; and
a plurality of via conductors penetrating through the resin insulating layer such that the plurality of via conductors is connecting the conductor layer and the second conductor layer,
wherein the second conductor layer includes a second solid layer, a first pad and a second pad formed such that the second solid layer has a third opening part and that the first pad and second pad are formed in the third opening part of the solid layer, the plurality of via conductors include a first via conductor connecting the first pad of the second conductor layer and the first land of the first wiring, and a second via conductor connecting the second pad of the second conductor layer and the second land of the second wiring, and the second conductor layer is formed such that the third opening part of the second solid layer is formed directly below the first opening part of the solid layer in the conductor layer and that the third opening part of the second solid layer has a shape which is substantially a same as a shape of the first opening part of the solid layer in the conductor layer.

16. The printed wiring board according to claim 1, further comprising:
- a second resin insulating layer formed on the resin insulating layer;
- a second conductor layer formed on a surface of the second resin insulating layer; and
- a plurality of via conductors penetrating through the resin insulating layer such that the plurality of via conductors is connecting the conductor layer and the second conductor layer,
- wherein the second conductor layer includes a second solid layer, a first pad and a second pad formed such that the second solid layer has a third opening part and that the first pad and second pad are formed in the third opening part of the solid layer, and the plurality of via conductors include a first via conductor connecting the first pad of the second conductor layer and the first land of the first wiring, and a second via conductor connecting the second pad of the second conductor layer and the second land of the second wiring.

17. The printed wiring board according to claim 16, wherein the first wiring of the plurality of wirings is formed such that the first portion is extending straight from the second portion to the first land, and the second wiring of the plurality of wirings is formed such that the third portion is extending straight from the fourth portion to the second land.

18. The printed wiring board according to claim 16, wherein the first wiring of the plurality of wirings is formed such that the first portion is extending beyond a boundary between the first opening part and second opening part of the solid layer and reaching from the second portion to the first land, and the second wiring of the plurality of wirings is formed such that the third portion is extending beyond the boundary between the first opening part and second opening part of the solid layer and reaching from the fourth portion to the second land.

19. The printed wiring board according to claim 16, wherein the plurality of wirings of the conductor layer is formed such that the first portion of the first wiring and the third portion of the second wiring are line-symmetric with respect to an imaginary straight line drawn between the first wiring and the second wiring.

20. The printed wiring board according to claim 19, wherein the first wiring of the plurality of wirings is formed such that a first angle between the first portion and the second portion is in a range of 145 degrees to 165 degrees, and the second wiring of the plurality of wirings is formed such that a second angle between the third portion and the fourth portion is in a range of 145 degrees to 165 degrees.

* * * * *